US009664726B2

(12) United States Patent
Platzer et al.

(10) Patent No.: US 9,664,726 B2
(45) Date of Patent: May 30, 2017

(54) SATELLITE COMMUNICATION SYSTEM

(71) Applicant: SPIRE GLOBAL, INC., San Francisco, CA (US)

(72) Inventors: Peter Platzer, San Francisco, CA (US); Joel Spark, Calgary (CA); Jeroen Cappaert, Sint-Gillis-Waas (BE)

(73) Assignee: SPIRE GLOBAL, INC., San Francisco, CA (US)

(*) Notice: Subject to any disclaimer, the term of this patent is extended or adjusted under 35 U.S.C. 154(b) by 195 days.

(21) Appl. No.: 14/514,573

(22) Filed: Oct. 15, 2014

(65) Prior Publication Data

US 2016/0111774 A1   Apr. 21, 2016

(51) Int. Cl.
*H01Q 1/28* (2006.01)
*G01R 31/04* (2006.01)
*H04N 5/225* (2006.01)
*H04N 5/232* (2006.01)
*H01Q 1/42* (2006.01)
*H05K 7/14* (2006.01)
*H04N 5/77* (2006.01)

(52) U.S. Cl.
CPC ........... *G01R 31/041* (2013.01); *H01Q 1/288* (2013.01); *H01Q 1/42* (2013.01); *H04N 5/2252* (2013.01); *H04N 5/23241* (2013.01); *H05K 7/1434* (2013.01); *H05K 7/1438* (2013.01); *H04N 5/77* (2013.01)

(58) Field of Classification Search
None
See application file for complete search history.

(56) References Cited

U.S. PATENT DOCUMENTS

| 5,410,728 | A | 4/1995 | Bertiger et al. |
| 5,604,920 | A | 2/1997 | Bertiger et al. |
| 5,940,739 | A | 8/1999 | Conrad et al. |
| 5,963,166 | A | 10/1999 | Kamel |
| 6,067,453 | A | 5/2000 | Adiwoso et al. |
| 6,163,302 | A * | 12/2000 | Bjorkengren .......... H01Q 1/243 343/702 |
| 6,271,877 | B1 | 8/2001 | LeCompte |
| 6,381,228 | B1 | 4/2002 | Prieto, Jr. et al. |
| 6,584,452 | B1 | 6/2003 | Prieto, Jr. et al. |
| 7,489,285 | B2 * | 2/2009 | Eckstein ................. H01Q 1/22 343/719 |
| 7,503,511 | B2 | 3/2009 | Mueller |
| 8,378,913 | B2 | 2/2013 | Tao et al. |

(Continued)

FOREIGN PATENT DOCUMENTS

EP   1037405 A2   9/2000

OTHER PUBLICATIONS

Canopus Systems, CubeSat Deployable Low Frequency Monopole Antenna, NASA Ames Research Park, Bldg. 19 Room 2077 Moffet Field, CA 94035, www.canopus-us.com, V1.0, Aug. 16, 2010.

(Continued)

*Primary Examiner* — Trinh Dinh
(74) *Attorney, Agent, or Firm* — Troutman Sanders

(57) ABSTRACT

A cubesat design includes selected subsystems for managing communications to other satellites and ground stations. In one embodiment, the subsystem includes a deployable antenna having compact size and low weight that reliably releases and detects an extended antenna after launch.

11 Claims, 4 Drawing Sheets

(56) References Cited

U.S. PATENT DOCUMENTS

| | | |
|---|---|---|
| 8,411,969 B1 | 4/2013 | Joslin et al. |
| 8,482,610 B2 | 7/2013 | do Carmo Miranda |
| 8,487,996 B2 | 7/2013 | Mann et al. |
| 8,531,524 B2 | 9/2013 | do Carmo Miranda |
| 2003/0217362 A1 | 11/2003 | Summers et al. |
| 2004/0263386 A1 | 12/2004 | King et al. |
| 2007/0182628 A1 | 8/2007 | Pomerantz et al. |
| 2008/0071633 A1 | 3/2008 | Ozkan et al. |
| 2009/0007240 A1 | 1/2009 | Vantalon et al. |
| 2012/0018585 A1 | 1/2012 | Liu et al. |
| 2013/0018529 A1 | 1/2013 | Ploschnitznig |
| 2013/0051661 A1 | 2/2013 | Robinson et al. |
| 2013/0271628 A1 | 10/2013 | Ku et al. |
| 2013/0298083 A1 | 11/2013 | Bertoldo et al. |
| 2014/0015970 A1 | 1/2014 | do Carmo Miranda |
| 2014/0027576 A1 | 1/2014 | Boshuizen et al. |
| 2014/0039963 A1 | 2/2014 | Augestein et al. |
| 2014/0040282 A1 | 2/2014 | Mann et al. |
| 2014/0059166 A1 | 2/2014 | Mann et al. |
| 2014/0263844 A1* | 9/2014 | Cook, Jr. ............... B64G 1/222 244/164 |
| 2015/0372374 A1* | 12/2015 | Judd ........................ H01Q 1/08 244/172.6 |
| 2016/0251092 A1* | 9/2016 | Cappaert ................ B64G 1/428 |
| 2016/0253284 A1* | 9/2016 | Cappaert ............. G06F 13/4282 710/301 |

OTHER PUBLICATIONS

European Search Report dated Jul. 22, 2016 issued in corresponding European Patent Application No. 14745871.5.
Carson-Jackson ("Satellite AIS-Developing Technology or Existing Capability?", The Journal of Navigation ;2012), 65, 303-321).

\* cited by examiner

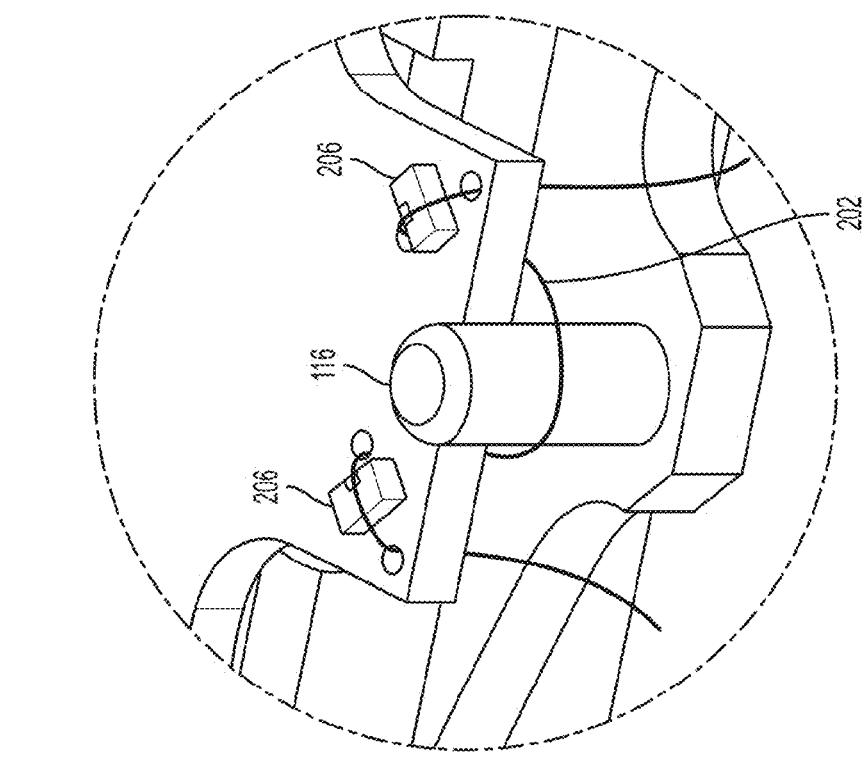
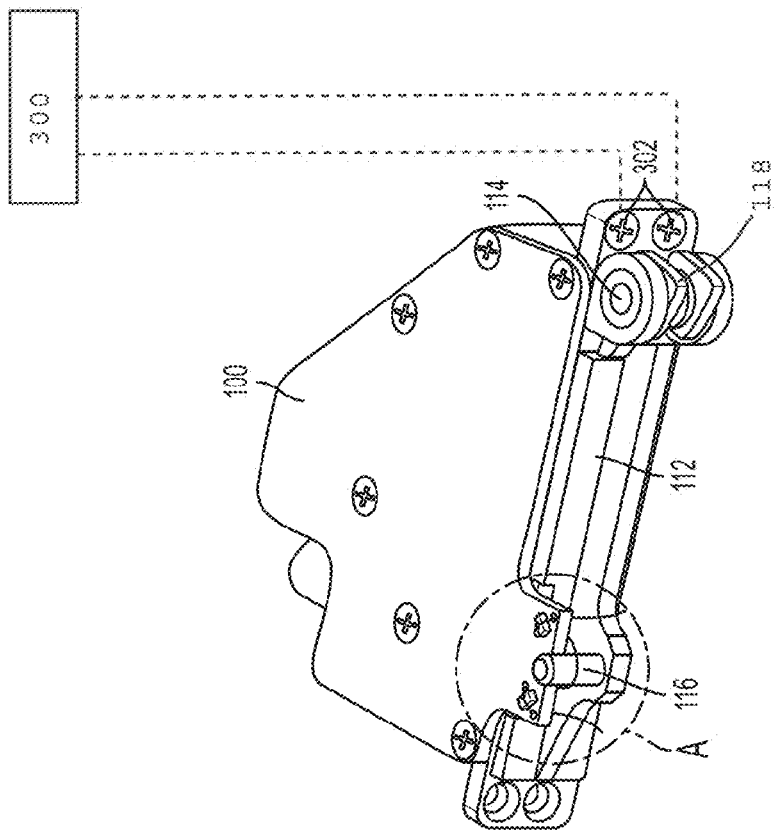
FIG. 4A
FIG. 4

SATELLITE COMMUNICATION SYSTEM

CROSS REFERENCE TO RELATED PATENT APPLICATIONS

This disclosure incorporates by reference the following pending U.S. patent applications: (1) Ser. No. 13/757,062, title: System And Method For Widespread Low Cost Orbital Satellite Access filed on Feb. 1, 2013; (2) Ser. No. 13/961,875, title: Computerized Nano-Satellite Platform For Large Ocean Vessel Tracking filed on Aug. 7, 2013; and (3) Ser. No. 13/961,384, title: System And Method For High-Resolution Radio Occultation Measurement Through The Atmosphere filed on Aug. 7, 2013. Further, this disclosure incorporates by reference U.S. patent application Ser. No. 14/514,836 filed Oct. 15, 2014, titled Back-Plane Connector for Cubesat. The contents of these applications are incorporated by reference herein as if each was restated in full.

FIELD OF INVENTION

The inventions herein are directed to novel systems and methods for supporting satellite design, manufacturing and operation. In particular, the present invention is directed to the design of small form factor satellites (known in the art as "cubesats"), including selected subsystems in satellite design directed to antenna storage and deployment.

BACKGROUND

A growing interest in low earth orbit satellites having a small form factor has led to an increase in both launches of the vehicles and the recognition that earlier techniques for manufacturing and control thereof are inadequate because of the specialized size and weight criteria of a typical cubesat. While standardized to some extent, significant variations in design have taken hold in this industry.

Due to their smaller size, cubesats generally cost less to build and deploy into orbit above the Earth. As a result, cubesats present opportunities for educational institutions, governments, and commercial entities to launch and deploy cubesats for a variety of purposes with fewer costs compared to traditional, large satellites.

SUMMARY

One aspect of the present invention is directed to the satellite antenna design. Satellite communication with ground stations and other satellites is maintained in operation using deployable and deployed antenna.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIGS. 4 and 4A illustrate a second view of the modular design utilizing a release mechanism and a magnified view thereof.

DETAILED DESCRIPTION

Figure 1:
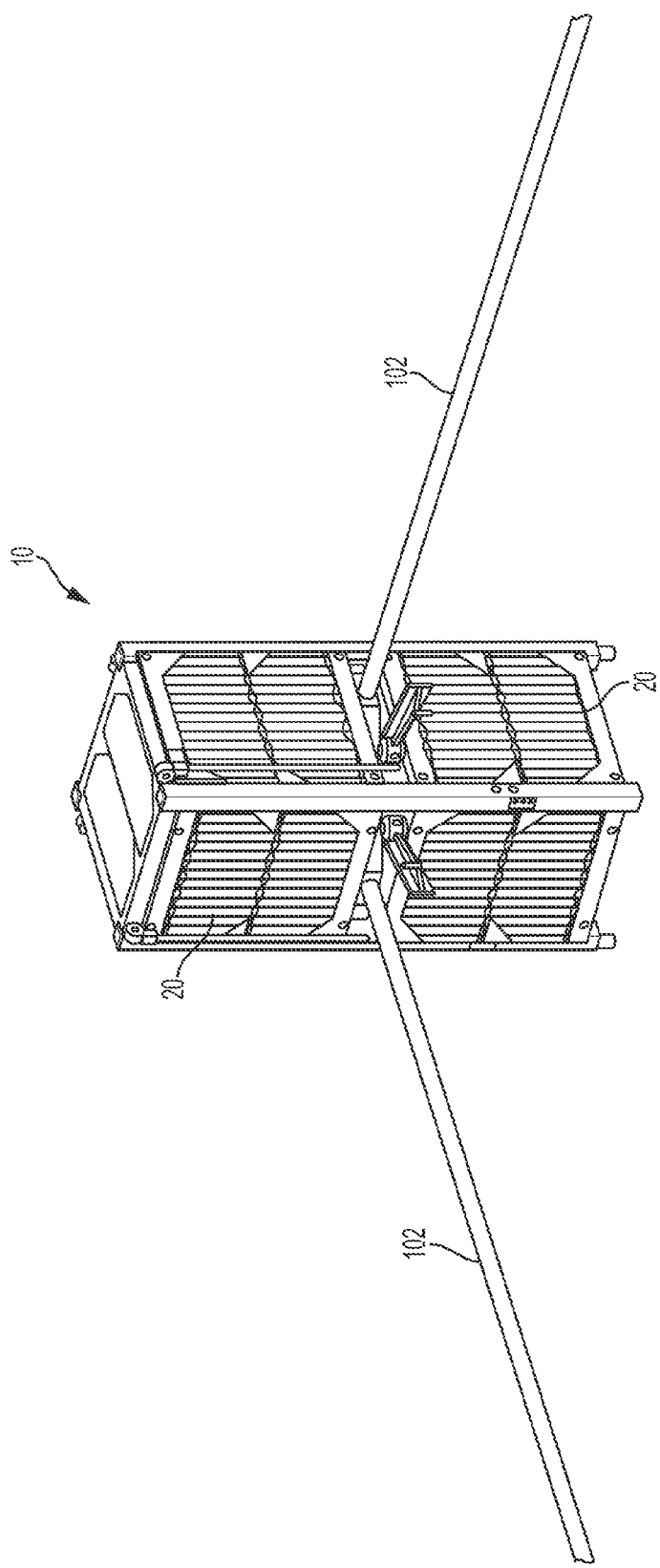
FIG. 1 is an isometric diagram of the cubesat with a deployed antennae array.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Certain challenges are presented when designing cubesats such as incorporating the desired structure and electronics into a relatively small form factor, maximizing the efficiency of the included components given volume and weight constraints, and providing sufficient communication systems to relay information to and from networked satellites within the constellation and ground-based systems. Imaging cubesats, for example, utilize much of the volume of the satellite for the imaging system, reducing the available space for other components, such as antennae for communication. Imaging cubesats can produce relatively large amounts of information making it desirable to incorporate a communication system capable of a relatively high data transmission rate, consequently making larger antenna systems more desirable.

Cubesats can be advantageous where satellite capabilities are desirable but the cost to manufacture and launch a traditional, large satellite is prohibitively expensive. Cubesats are smaller and weigh less than traditional, large satellites and therefore are generally less costly to manufacture and launch into orbit. Challenges arise, however, in reducing the size of components and systems to fit into a cubesat while maintaining functionality. For instance, large satellites may include large communications antennae making high data transmission rates possible. Cubesats, on the other hand, are limited in the size of antenna that may be included, possibly reducing the data transmission rate available. The gain of the antenna may also be affected by the size of the antenna, affecting the link margin and size of corresponding communication systems. The gain of the antenna may also be affected by the frequency band of communication with the ground or other satellites.

It would be advantageous, then, for a cubesat system to increase the gain of the antenna system, and the data transmission rate, while maintaining the size within a desired envelope and the communication frequency within an allocated band.

To increase the utility of cubesats, therefore, it would be advantageous to incorporate a relatively high gain antenna into a small form factor of the cubesats.

The present example provides a small form factor and light antenna with high gain capabilities. The cubesat, in one embodiment, is based on an industry standard, developed in 2001 by Stanford University and California Polytechnic Institute and described in the document "CubeSat Design Specification." The size and sophistication of the satellite is such that it fits the overall design and objectives of the operative platform used to support it. The size of the satellite can be relatively small, in general not exceeding 10 cm×10 cm×30 cm and 10 kg of mass, and the design includes around 25 separate sensors connected to and in communication with the central processing unit of the satellite. These sensors include a plurality of frequency specific monitors such as UV (Ultraviolet) and IR (infrared); other sensors are for remote detection of surface temperature; spectroscopy and one or more accelerometers; other onboard devices include camera/vision systems for still and video capture.

Figure 2:
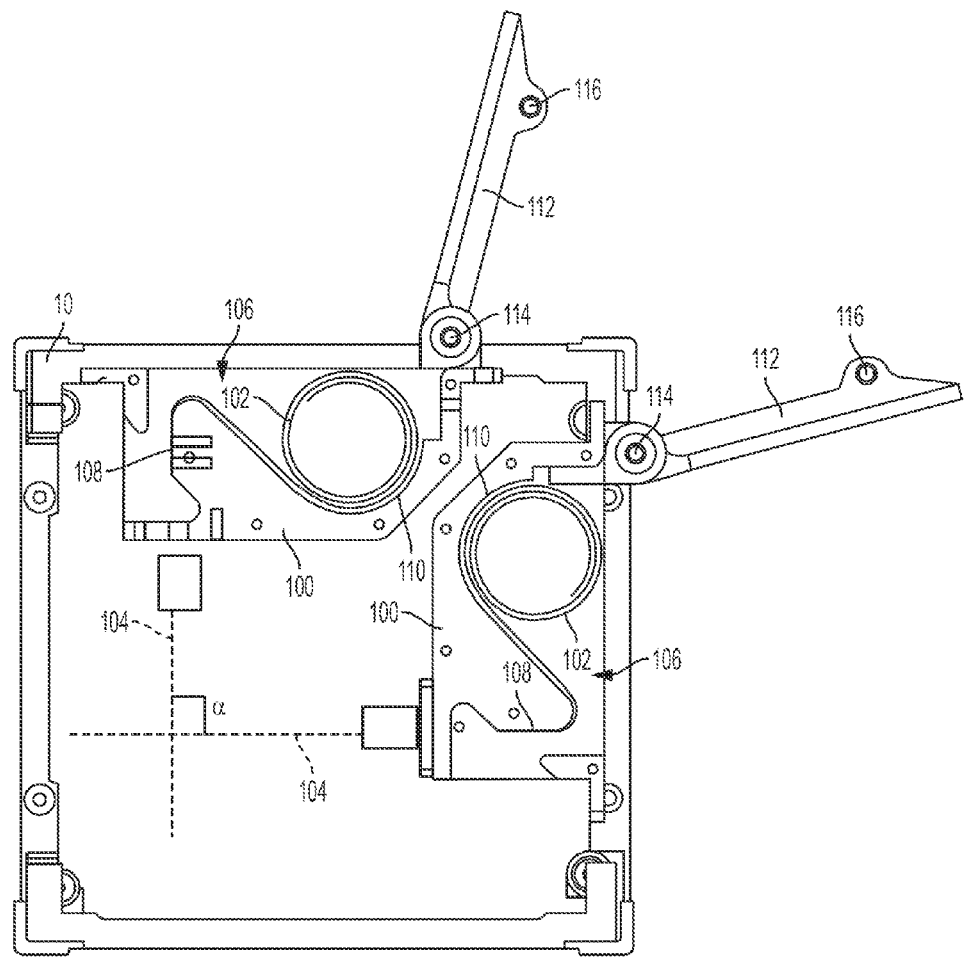
FIG. 2 is a plan cross-section diagram of the cubesat of FIG. 1 depicting two coiled antenna prior to deployment.

FIGS. 1 and 2 illustrate an example of a cubesat 10 which includes solar panels 20 to provide energy to the internal components of the cubesat 10. In this example, there are two antenna housings 100 each enclosing a separate antenna 102. FIG. 1 illustrates both of the antennae 102 fully deployed. FIG. 2 illustrates the undeployed antennae 102 and their individual deployment axes 104. The deployment axes 104 are the axes over which the antennae 102 extend when deployed. In the present example, when the two housings 100 are mounted in the cubesat 10, their deployment axes 104 form an angle a at 90° between them.

Figure 3A:
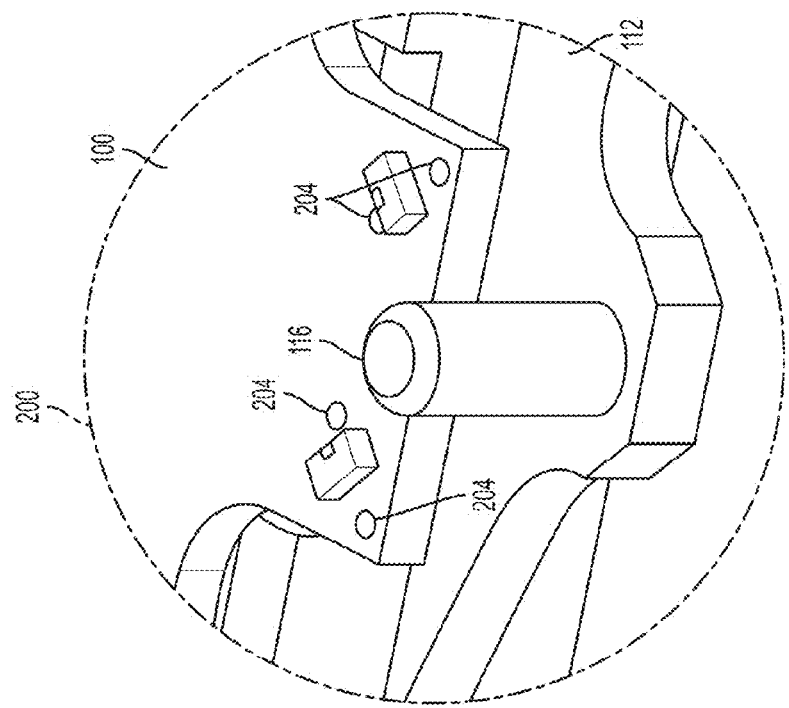
FIGS. 3 and 3A illustrate a module antenna casing for storing and releasing a coiled antenna and a magnified view thereof.
Figure 3:
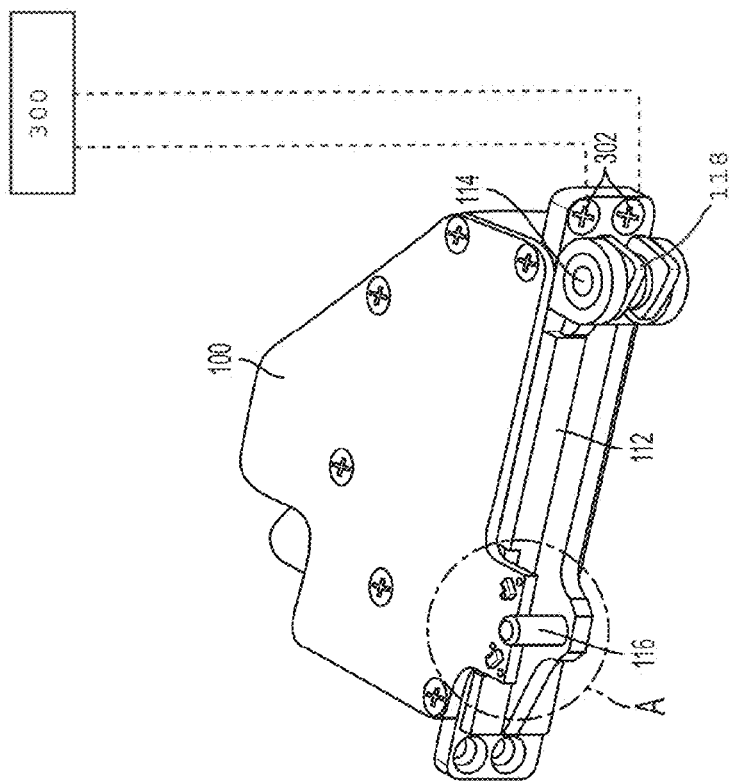

Turning now to FIGS. 2, 3, and 4, a series of figures illustrate different views of antenna storage and deployment subsystem. As depicted in FIG. 2, the antenna 104 is coiled into a shaped containment slot 106. The containment slot 106 includes an antenna anchor point 108 and a recess 110 to hold the coiled antenna 102. The housing 100 also includes a door 112 that can allow selectable access to the recess 110. The door 112 is connected to hinge 114 and the housing 100 on door side proximal to hinge 114, and detachably anchored on the distal end. The door 112 is detachably engaged in its closed position by holding pin 116.

The antenna 102 itself is formed of a thin aluminum metal sheet with a selected spring constant. While the metal is thin, it can be cambered (curved) along its shorter axis to increase rigidity. This concept is also used for metal tape measures. The metal is thin enough to coil, but once uncoiled, the camber provides enough stiffness that the antenna 102 is linearly deployed and does not fold, flop or droop.

During storage and launch, the coiled antenna 102 is held compressed and in place in the containment slot 106 by door 112, that defines an antenna containment space. When the door 112 is shut, the antenna 102 exerts some spring pressure against the door 112, but the antenna 102 is held fast by door 112. The coiled shape of the antenna 102 conforms to the recess 110, which is sized for the coiled antenna 102 and prevents the antenna 102 to expand in any direction except the opening created by door 112.

In one embodiment, there is a single door 112 on one wall that is opened by a signal controlled latching mechanism 200, releasing the antenna 102, thus allowing the unfurling extension of the metal antenna 102 to its final linear shape driven by the spring force of the metal. FIG. 2 illustrates the open door 112 and the coiled antenna 102. As depicted, the opening created by Door 112 allows for the unfurling of an exemplary 24 inch antenna through this passageway.

Turning now to the signal controlled latching mechanism 200, as illustrated in FIGS. 3A and 4A. The coiled antenna 102 resides in its containment slot 106 in the housing 100 on the satellite 10 pressed against the latched door 112. In one example of the signal controlled latching mechanism 200, a thin wire 202 wraps around the holding pin 116 and is secured to the housing 100. In this example, the wire 202 is secured through apertures 204 in the housing 100. In one specific example, the thin wire 202 is made from monofilament UHDPE (ultra-high-density polyethylene) that is 10 mm thick. The wire 202 has sufficient strength to hold the door 112 closed against the spring force of the coiled antenna 102. The wire 202 is "tied" through the apertures 204 and positioned so that the wire is juxtaposed against two resistors, 206. Once in place, the wire is wrapped around the pin 116, the door 112 is held closed. The antenna 102 is deployed by a signal that applies a current across the resistors 206 causing the plastic wire 202 to melt and break.

FIGS. 1 and 2 illustrate the door 112 in the fully open or deployed position. In one example, the door 112 can be held in the open position or allowed to freely pivot after the antenna is deployed.

The example of the latching mechanism 200 and antenna 102 minimizes both weight and components required for operation. The door 112 pivots at hinge 114 and, because movement is driven by the coiled spring force of the antenna 102, the door does not require a separate spring loaded hinge to open, saving weight. Further, the use of the wire 202, also simplifies the locking of the door 112.

Another feature of the present system is a deployment confirmation system 300 (or an AIS "automatic identification system"). When the proper signal is provided to the latch mechanism 200, the resistors 206 are energized, melting the wire 202 and as the door swings open, the spring force in coiled antenna 102 causes the unraveling of coil to force the door 112 open to a full open position. When the door 112 is its full open position, a contact arm 118 bridges two contacts 302 which creates a connection (e.g. closes a circuit) triggering a signal to the system 300 confirming that door 112 has reached its full open position—allowing the antenna deployment. The contacts 302 are provided by two screws that close the circuit, creating the "antenna deployed" signal.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claim is:

1. A cubesat communication system comprising:
   a structure, in the cubesat communication system, including:
      an antenna that has a coiled profile when the antenna is not deployed, and transforms from the coiled profile to a straight line profile when the antenna is deployed;
      a storage slot defined in the structure for storing the antenna when the antenna is not deployed, and
      a hinged door that has a closed position to close the storage slot, the door being releaseably held in the closed position by a meltable wire;
   a control connector, in the cubesat communication system, for releasing said door from the closed position and deploying said antenna; and
   a detector, in the cubesat communication system, for generating a signal that indicates a successful deployment of the antenna.

2. The cubesat communication system of claim 1, wherein during the deployment of the antenna, the antenna exerts its spring force on the door to open the door.

3. The cubesat communication system of claim 1, wherein when the door is in an open position, a circuit in connection with the door is closed and triggers a signal to the detector confirming that the door reaches the open position.

4. The cubesat communication system of claim 3, wherein said circuit is closed when a contact arm in connection with the door contacts two metal screws.

5. The cubesat communication system of claim 1, wherein the antenna is about two feet in length in a deployed linear position.

6. The cubesat communication system of claim 1, wherein said wire is made of ultra-high-density-polyethylene and approximately 10 mm thick.

7. The cubesat communication system of claim 1, wherein the structure includes a second storage slot to accommodate a second antenna, and the second antenna extends from a coiled profile to a straight line profile when the second antenna is deployed.

8. The cubesat communication system of claim 7, wherein when the two antennae are deployed, they form a predetermined angle between them.

9. The cubesat communication system of claim 1, wherein the wire has sufficient strength to hold the door in the closed position against spring force of the antenna.

10. The cubesat communication system of claim 1, wherein the wire is in contact with two resistors.

11. The cubesat communication system of claim 10, wherein the control connector releases the door from the closed position by sending a signal to apply a current across the resistors and cause the wire to melt.

* * * * *

UNITED STATES PATENT AND TRADEMARK OFFICE
CERTIFICATE OF CORRECTION

PATENT NO. : 9,664,726 B2
APPLICATION NO. : 14/514573
DATED : May 30, 2017
INVENTOR(S) : Peter Platzer, Joel Spark and Jeroen Cappaert It is certified that error appears in the above-identified patent and that said Letters Patent is hereby corrected as shown below:

On the Title Page

Item (54) Title:
"SATELLITE COMMUNICATION SYSTEM" should read --NOVEL SATELLITE COMMUNICATION SYSTEM--

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*